(12) United States Patent
Lee et al.

(10) Patent No.: US 8,577,325 B2
(45) Date of Patent: Nov. 5, 2013

(54) LOW NOISE AMPLIFIER HAVING BOTH ULTRA-HIGH LINEARITY AND LOW NOISE CHARACTERISTIC AND RADIO RECEIVER INCLUDING THE SAME

(75) Inventors: Kwy Ro Lee, Daejeon (KR); Bum Kyum Kim, Daejeon (KR); Dong Gu Im, Daejeon (KR); Jae Young Choi, Daegu (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 202 days.

(21) Appl. No.: 13/050,130

(22) Filed: Mar. 17, 2011

(65) Prior Publication Data

US 2012/0064852 A1   Mar. 15, 2012

(30) Foreign Application Priority Data

Aug. 31, 2010 (KR) .................. 10-2010-0085078
Jan. 20, 2011 (KR) .................. 10-2011-0006022

(51) Int. Cl.
*H04B 1/16* (2006.01)
(52) U.S. Cl.
USPC ........................................ 455/341; 330/277
(58) Field of Classification Search
USPC ........... 455/194.1, 194.2, 285, 295, 296, 341; 330/253, 261, 277
See application file for complete search history.

(56) References Cited

U.S. PATENT DOCUMENTS 8,233,871 B2* 7/2012 Keehr et al. ................... 455/285
2005/0227652 A1* 10/2005 Kang et al. ................. 455/194.2
2007/0216481 A1* 9/2007 Jimenez et al. ............... 330/253

OTHER PUBLICATIONS

T.W. Kim et al., "Highly Linear Receiver Front-End Adopting MOSFET Transconductance Linearization by Mulitple Gated Transistors", IEEE Journal of Solid-State Circuits, vol. 39, No. 1, Jan. 2004, pp. 223-229.

* cited by examiner

*Primary Examiner* — Thanh Le
(74) *Attorney, Agent, or Firm* — Gesmer Updegrove LLP

(57) ABSTRACT

Disclosed herein is a low noise amplifier having both ultra-high linearity and a low noise characteristic and a radio receiver including the low noise amplifier. The low noise amplifier includes a first main transistor unit, a first auxiliary transistor unit, and an optimum noise and input impedance matching capacitor. The first main transistor unit includes a first NMOS transistor and a first PMOS transistor configured to form a complementary common source amplifier, a feedback-type resistor connected between drains of the first NMOS transistor and the first PMOS transistor and configured to generate biases to the two transistors, and bias resistors connected to bodies of the first PMOS transistor and the first NMOS transistor. The first auxiliary transistor unit includes transistors connected to the two transistors. The optimum noise and input impedance matching capacitor is connected to output terminals of the first main transistor unit and the first auxiliary transistor unit.

20 Claims, 7 Drawing Sheets

LOW NOISE AMPLIFIER HAVING BOTH ULTRA-HIGH LINEARITY AND LOW NOISE CHARACTERISTIC AND RADIO RECEIVER INCLUDING THE SAME

CROSS-REFERENCE TO RELATED APPLICATION

This application claims priority to Korean Patent Application No. 10-2010-0085078, filed on Aug. 31, 2010, and Korean Patent Application No. 10-2011-0006022, filed on Jan. 20, 2011, and all the benefits accruing therefrom under 35 U.S.C. §119, the contents of which in their entirety are herein incorporated by reference.

BACKGROUND OF THE INVENTION

1. Field of the Invention

The present invention relates generally to a low noise amplifier which is capable of achieving both ultra-high linearity and a low noise characteristic, and a radio receiver which includes the low noise amplifier, and, more particularly, to a low noise amplifier having both ultra-high linearity and a low noise characteristic, in which linearity has been maximized by body biasing and complementary linearization using an auxiliary transistor in a complementary common source low noise amplifier, and a radio receiver which includes the low noise amplifier.

2. Description of the Related Art

A radio receiver includes a low noise amplifier (LNA), and amplifies radio frequency signals received by an antenna. A radio receiver may be provided in various devices, including a digital television, a digital direct broadcasting system, a Personal Digital Assistant (PDA), a laptop computer, a desktop computer, a digital multimedia player, a portable game machine, a video game console, a digital camera, a digital recording device, a cellular or satellite wireless phone, a Radio Frequency (RF) Identification (ID) device, a smart phone, etc.

A radio receiver includes an antenna, a low noise amplifier (LNA), a down-conversion mixer, an Analog-Digital Converter (ADC), and a modem. Since the low noise amplifier is a first amplifier in a receiving path, it has the greatest influence on the noise figure of the entire receiving path, so the low noise amplifier should be designed to have a particularly small noise figure, to allow input/output impedance to easily match 50Ω, and to have excellent linearity.

It is required that next generation mobile communication terminals should be provided with multi-band, multi-mode, multi-standard connectivity which is capable of supporting 15 or more different communication methods. For this purpose, in a radio transmission/reception unit, a Surface Acoustic-Wave (SAW) filter is included in a lead-in RF signal path between a low noise amplifier LNA and a mixer. However, a SAW filter causes an increase in the manufacturing cost of a terminal because it is expensive, and the SAW filter is an obstacle to the realization of a small and thin terminal because the SAW filter increases the volume of the terminal. Accordingly, it is necessary to implement a mobile communication terminal with appropriate performance without using a SAW filter.

However, in a SAW-less receiver, significant transmission loss is generated from various channels or a transmission unit and receiving sensitivity is significantly deteriorated due to the inter- and cross-modulation of a jammer. Accordingly, it is desirable to develop a low noise amplifier having excellent linearity and a low noise characteristic, which is capable of supporting the excellent receiving sensitivity of a SAW-less receiver.

SUMMARY OF THE INVENTION

Therefore, the present invention has been made in view of the above problems of the prior art, and an exemplary embodiments of the present invention provide a low noise amplifier which is capable of achieving both ultra-high linearity and a low noise characteristic.

In accordance with an exemplary embodiment of the present invention, there is provided a radio receiver which includes the low noise amplifier, so that the radio receiver can be implemented without using a SAW filter and provides excellent receiving sensitivity.

In an embodiment, there is provided a low noise amplifier having both ultra-high linearity and a low noise characteristic, including:

a first main transistor unit including a first NMOS transistor and a first PMOS transistor configured to form a complementary common source amplifier, a feedback-type resistor connected in parallel between drains of the first NMOS transistor and the first PMOS transistor and configured to generate biases to the two transistors, and bias resistors connected to the bodies of the first PMOS transistor and the first NMOS transistor; a first auxiliary transistor unit including transistors connected in parallel to the two transistors of the first main transistor unit; and an optimum noise and input impedance matching capacitor $C_L$ connected in common to the output terminals of the first main transistor unit and the first auxiliary transistor unit.

The first auxiliary transistor unit may include a second PMOS transistor configured such that a source and drain of the first PMOS transistor are connected in parallel thereto; a third PMOS transistor connected behind the second PMOS transistor and configured such that a source and drain thereof are connected in parallel to the first PMOS transistor and the second PMOS transistor; a second NMOS transistor configured such that a source and drain of the first NMOS transistor are connected in parallel thereto; and a third NMOS transistor connected behind the second NMOS transistor and configured such that a source and drain thereof are connected in parallel to the first NMOS transistor and the second NMOS transistor.

The low noise amplifier may further include a linearized complementary common gate amplifier, a transformer, or an LC network connected to the optimum noise and input impedance matching capacitor $C_L$.

In another embodiment, there is provided a radio receiver, including a low noise amplifier for amplifying an input wireless signal; a mixer for down-converting a frequency of an output signal of the low noise amplifier circuit; an analog to digital converter (ADC) for converting an output signal of the mixer into a digital signal; and a digital signal processor for recovering data from the digital signal, wherein the low noise amplifier includes a first main transistor unit including a first NMOS transistor and a first PMOS transistor configured to form a complementary common source amplifier, a feedback-type resistor connected in parallel between the drains of the first NMOS transistor and the first PMOS transistor and configured to generate biases to the two transistors, and bias resistors connected to the bodies of the first PMOS transistor and the first NMOS transistor; a first auxiliary transistor unit including transistors connected in parallel to the two transistors of the first main transistor unit; and an optimum noise and input impedance matching capacitor $C_L$ connected in common to the output terminals of the first main transistor unit and the first auxiliary transistor unit.

The radio receiver may further include a linearized complementary common gate amplifier, a transformer, or an LC network connected to the optimum noise and input impedance matching capacitor $C_L$ in order to improve linearity.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
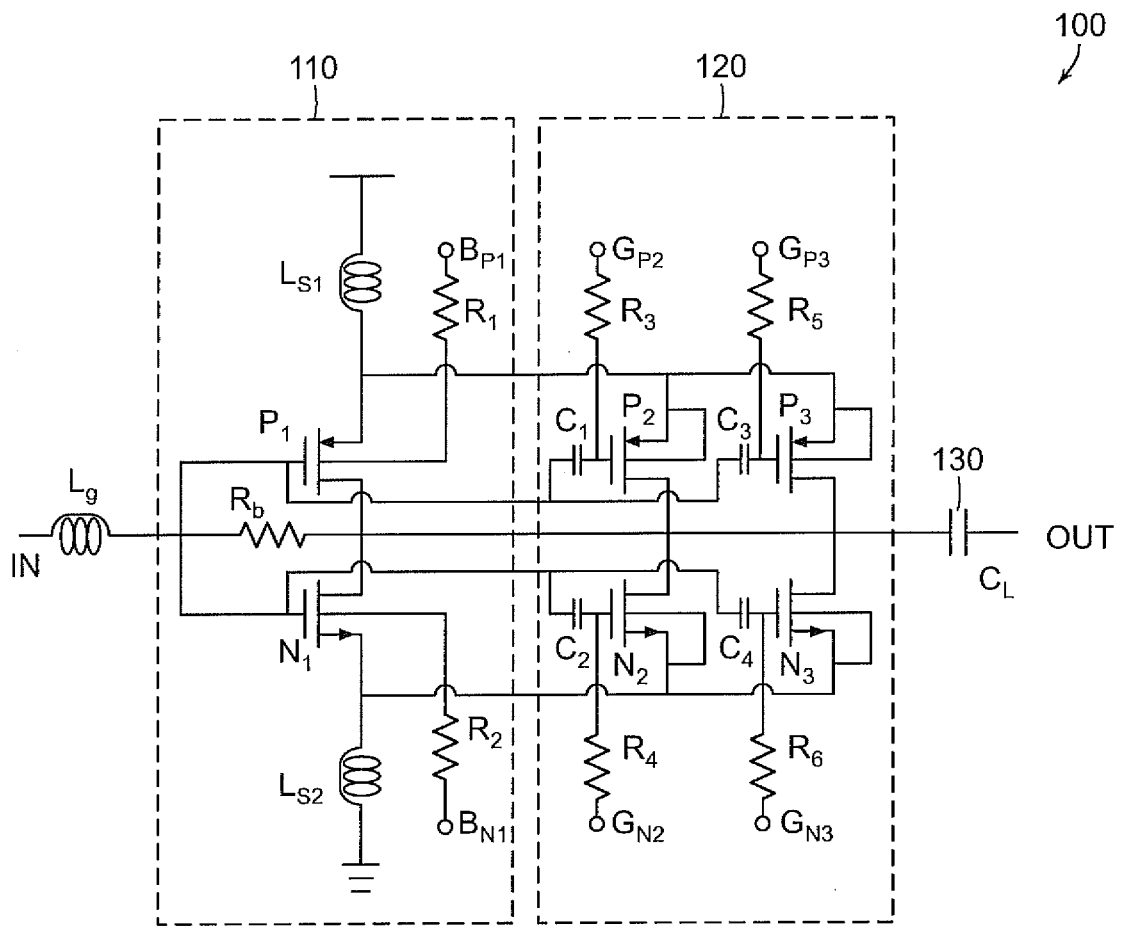
FIG. 1 is a circuit diagram of a low noise amplifier according to an embodiment of the present invention.

Exemplary embodiments will now be described in greater detail hereinafter with reference to the accompanying drawings, in which embodiments of the invention are shown. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or one or more intervening elements may be present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference now should be made to the accompanying drawings, in which the same reference numerals are used throughout the different drawings to designate the same or similar components.

Embodiments of the present invention will be described in detail below with reference to the accompanying drawings.

FIG. 1 is a circuit diagram of a low noise amplifier according to an embodiment of the present invention. Referring to FIG. 1, the low noise amplifier according to the embodiment of the present invention is a linearized complementary common source low noise amplifier 100, and includes a first main transistor unit 110, a first auxiliary transistor unit 120, and an optimum noise and input impedance matching capacitor $C_L$ 130. The first main transistor unit 110 includes a first NMOS transistor N1 and a first PMOS transistor P1 configured to form a complementary common source amplifier, a feedback-type resistor $R_b$ connected in parallel between the drains of the first NMOS transistor N1 and the first PMOS transistor P1 and configured to generate biases to the two transistors, and further includes a bias resistor $R_1$ connected to the body of the first PMOS transistor P1 and a bias resistor $R_2$ connected to the body of the first NMOS transistor N1, so as to perform body biasing. The first auxiliary transistor unit 120 includes transistors which are connected in parallel to the first NMOS transistor N1 and first PMOS transistor P1 of the first main transistor unit 110. The capacitor $C_L$ 130 which is connected in common to the output terminals of the first main transistor unit 110 and the first auxiliary transistor unit 120 can match both optimum noise and input impedance. The capacitor $C_L$ 130 has decreased capacitance, and thus can act as a DC block capacitor and a load capacitor as well. Accordingly, the capacitor $C_L$ 130 may contribute to generate the real part of the input impedance at the input terminal.

Referring to FIG. 1, the first main transistor unit 110 has a complementary common source amplifier structure which includes the first NMOS transistor N1 and the first PMOS transistor P1 which are connected in common to the resistor $R_b$. The gates of the first PMOS transistor P1 and the first NMOS transistor N1 receive an input signal $V_{IN}$ in common, the input signal $V_{IN}$ is amplified, and an output signal $V_{OUT}$ is output via the drains of the first PMOS transistor P1 and the first NMOS transistor N1 connected in common. Such a complementary common source amplifier structure has high gain, has excellent linearity because it has a push-pull structure, and can easily perform input matching and output matching, compared to other structures.

The first main transistor unit 110 includes the first PMOS transistor P1 and the first NMOS transistor N1 configured to form a complementary common source amplifier, the resistor $R_b$ connected in parallel between the drains of the first PMOS transistor P1 and the first NMOS transistor N1 and configured to apply biases to the PMOS transistor P1 and the first NMOS transistor N1, an optimum noise and input impedance matching first inductor $L_g$ configured such that one end thereof is connected to an input terminal and the remaining end thereof is connected in common to the gates of the PMOS transistor P1 and the first NMOS transistor N1 and the resistor $R_b$, input impedance matching second inductor $L_{S1}$ configured such that one end thereof is connected to supply voltage and the remaining end thereof is connected to the source of the first PMOS transistor P1, and input impedance matching third inductor $L_{S2}$ configured such that one end thereof is connected to the source of the first NMOS transistor N1 and the remaining end thereof is connected to a ground.

An input matching circuit includes the first inductor $L_g$ for performing input matching, the second and third inductors $L_{S1}$ and $L_{S2}$ for functioning as feedback inductors, and the capacitor $C_L$ 130. In this circuit, the feedback inductors $L_{S1}$ and $L_{S2}$ of the source terminals of the first NMOS transistor N1 and the first PMOS transistor P1 are source-degenerated, and an inductors $L_g$ is provided in the gates thereof in order to perform input impedance matching. The real part of input impedance is generated using the devices $L_{S1}$, $L_{S2}$ and CL having imaginary part impedance, and the voltage of the input signal is amplified using $L_g$ and input to the transistors, so that the noise figure can be considerably reduced. The resistor $R_b$ applies biases to the first NMOS transistor N1 and the first PMOS transistor P1. In this case, the resistor $R_b$ has a value greater than the output resistor value, so that only Direct Current (DC) biases are applied. Since the complementary common source low noise amplifier according to the present invention includes the PMOS transistor and the NMOS transistor and therefore DC bias is determined by negative feedback based on the high-resistance resistor $R_b$, an external bias device is not required.

The capacitor $C_L$ 130 of the complementary common source low noise amplifier is connected in common to the output terminals of the first main transistor unit 110 and the first auxiliary transistor unit 120, and enables input impedance matching and optimum noise matching at the same time. Referring to the following Equation 1, the noise figure F of a circuit which employs a capacitive load is not a function of $C_L$, so that $C_L$ does not influence the noise figure of the low noise amplifier.

$$F = 1 + \frac{1}{g_m^2 + \omega_0^2 C_{gd}^2} \cdot \frac{g_m}{2} \cdot \left[ C_1(\omega_0(C_{gd} + C_{gs}))^2 + C_2 \left( \frac{1 + \omega_0^2 L_s C_{gd}}{1 + 2\frac{C_{gd}}{C_{gs}}} \right)^2 \right] \quad (1)$$

The current flowing through $C_L$ includes two components, that is, signal current amplified by the transistor and noise current. Since these two currents are added before passing through $C_L$, $C_L$ functioning as a load does not influence the noise figure. However, the variation in input impedance attributable to $C_L$ is present, and input impedance $Z_{in}$ is the function of $C_L$, as expressed by the following Equation 2:

$$Z_{in} = \frac{K_1}{C_L} + j(\omega \cdot L_g - K_2 \cdot \text{function of } (C_L, \omega)) \quad (2)$$

where $K_1$ and $K_2$ are constants.

Accordingly, when a capacitance component is present in load impedance, the real part component of the input impedance can be derived. Accordingly, optimum noise matching which achieves minimum noise $NF_{min}$ is performed using $L_g$, $L_s$ and the width of the transistor, and then input impedance matching is performed using $C_L$, thereby achieving both input impedance matching and optimum noise matching.

Meanwhile, the first auxiliary transistor unit 120 includes a second PMOS transistor P2 configured such that the source and drain of the first PMOS transistor P1 are connected in parallel thereto; a third PMOS transistor P3 connected behind the second PMOS transistor P2 and configured such that the source and drain thereof are connected in parallel to the first PMOS transistor P1 and the second PMOS transistor P2; a second NMOS transistor N2 configured such that the source and drain of the first NMOS transistor N1 are connected in parallel thereto; and a third NMOS transistor N3 connected behind the second NMOS transistor N2 and configured such that the source and drain thereof are connected in parallel to the first NMOS transistor N1 and the second NMOS transistor N2. The source and drain of the third PMOS transistor P3 are respectively connected to the source and drain of the first PMOS transistor P1, and are also respectively connected to the source and drain of the second PMOS transistor P2. The source and drain of the third NMOS transistor N3 are respectively connected to the source and drain of the first NMOS transistor N1, and are also respectively connected to the source and drain of the second NMOS transistor N2.

The gates of the transistors of the first auxiliary transistor unit 120 are connected in parallel to the gates of the transistors of the first main transistor unit 110 via Alternating Current (AC) coupling capacitors $C_1$, $C_2$, $C_3$ and $C_4$, so that AC signal components are input to the gates of the transistors of the first auxiliary transistor unit 120. Bias resistors $R_3$, $R_5$, $R_4$ and $R_6$ with high resistance values are respectively connected to the gates of all auxiliary transistors P2, P3, N2 and N3 which constitute the first auxiliary transistor unit 120, so that different DC bias voltages are input to the gates of the auxiliary transistors.

In the present invention, the number of auxiliary transistors P2, P3, N2 and N3 which constitute the first auxiliary transistor unit 120 is not specially limited. Although in the embodiment shown in FIG. 2, the first auxiliary transistor unit 120 includes four auxiliary transistors, more than four transistors may be included in some other embodiment.

The first auxiliary transistor unit 120 is configured to allow linear output current to be generated by adjusting the bias voltages of the second PMOS transistor P2, the third PMOS transistor P3, the second NMOS transistor N2 and the third NMOS transistor N3, thereby preventing linearity from being reduced by an voltage swing from input signal. Since different gate bias voltages are applied to the auxiliary transistors P2, P3, N2 and N3 of the first auxiliary transistor unit 120, linearity can be improved. In the low noise amplifier of the present invention, in order to prevent linearity from being reduced regardless of a high input signal, different DC voltages are applied to the gates of the respective auxiliary transistors.

For example, when the power of the input signal is high, the absolute value of $V_{gs}$ of each transistor of the first auxiliary transistor unit is higher than $V_{th}$, so that all the transistors operate in the active region. In contrast, when the power of the input signal is low, the absolute value of $V_{gs}$ of each transistor of the first auxiliary transistor unit is lower than $V_{th}$, so that all the transistors operate in the cut-off region except for the main transistors. Meanwhile, when the input signal has an intermediate magnitude, the absolute value of $V_{gs}$ of each of some transistors is higher than $V_{th}$ and the absolute value of $V_{gs}$ of each of the remaining transistors is lower than $V_{th}$, so that some transistors may operate in the active region and the remaining transistors may operate in the cut-off region.

As shown in FIG. 1, biases $B_{P1}$ and $B_{N1}$ connected to the transistors of the first main transistor unit 110 are body biases, while biases $G_{P2}$, $G_{P3}$, $G_{N2}$ and $G_{N3}$ connected to the transistors of the first auxiliary transistor unit 120 are gate biases.

The bodies of the second PMOS transistor P2 and the second NMOS transistor N2 and the bodies of the third PMOS transistor P3 and the third NMOS transistor N3 are coupled to the sources of the respective transistors. In the low noise amplifier of the present invention, the transistors may be 4-terminal transistors and, accordingly, bodies are connected to sources, thereby suppressing a reduction in transconductance by eliminating the body effect.

Figure 2:
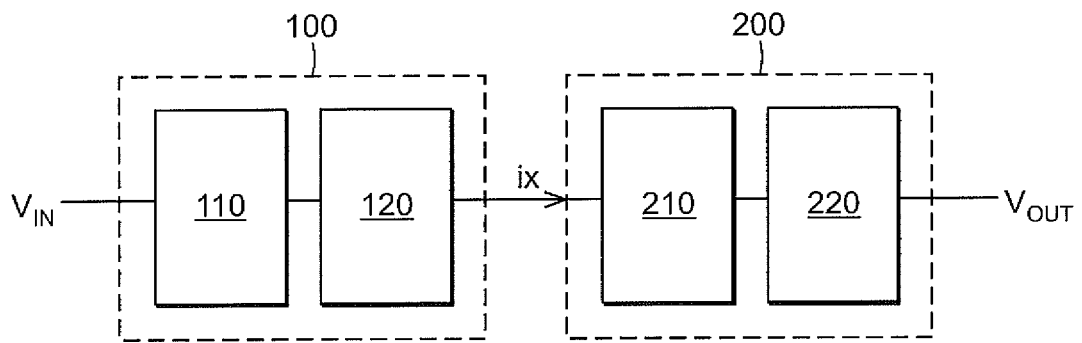
FIG. 2 is a block diagram of a low noise amplifier according to another embodiment of the present invention, which includes a linearized complementary common gate amplifier in addition to a linearized complementary common source low noise amplifier.

FIG. 2 is a schematic block diagram of a low noise amplifier according to another embodiment of the present invention. In the low noise amplifier according to another embodiment of the present invention, a linearized complementary common gate amplifier 200 is connected to the output terminal of the optimum noise and input impedance matching capacitor $C_L$ of the above-described linearized complementary common source low noise amplifier 100. Referring to FIG. 2, the low noise amplifier according to another embodiment of the present invention includes the linearized complementary common source low noise amplifier 100, including the first main transistor unit 110, the first auxiliary transistor unit 120 and the optimum noise and input impedance matching capacitor $C_L$ 130, and the linearized complementary common gate amplifier 200, including a second main transistor unit 210 and a second auxiliary transistor unit 220. The linearized complementary common source low noise amplifier 100 improves noise characteristics by matching both input impedance and noise using the optimum noise and input impedance matching capacitor $C_L$, and improves small-signal linearity and large-signal linearity by performing body biasing and complementary linearization. The linearized complementary common gate amplifier 200 further improves large-signal linearity by preventing linearity from being reduced due to the large voltage swing of the output terminal of the linearized complementary common source low noise amplifier 100.

The low noise amplifier according to this embodiment implements "noise matching" which enables the internal noise of the amplifier to be suppressed to the minimum value and "input impedance matching" which enables a signal to be input without causing power loss, and significantly improves small-signal linearity OIP3 and large-signal linearity OP1 dB without reducing gain, thereby being advantageously applied to a SAW-less receiver. The output terminal of the low noise amplifier of the present invention may be followed by the input terminal of a mixer.

Figure 3:
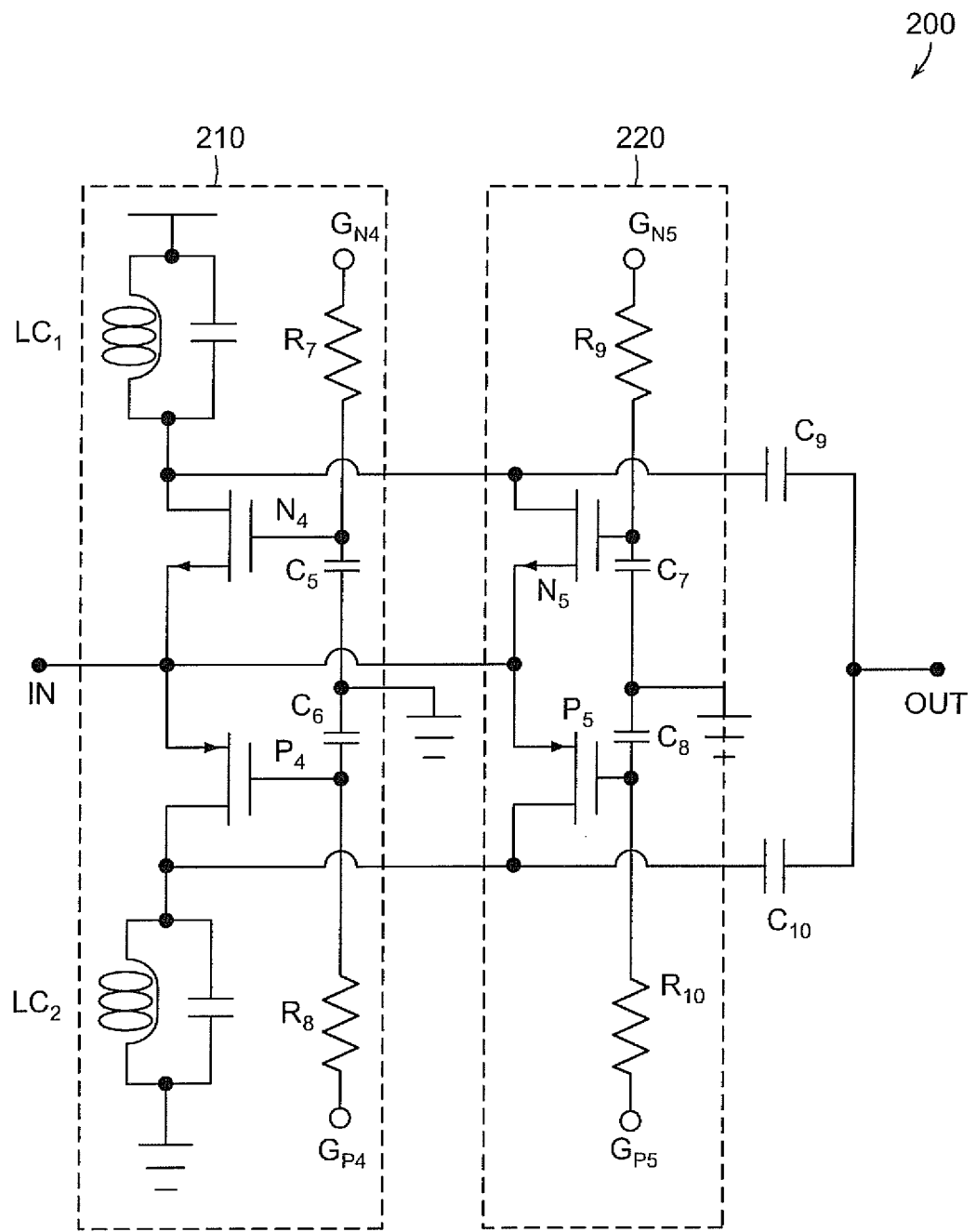
FIG. 3 is a circuit diagram of the linearized complementary common gate amplifier of the low noise amplifier according to the embodiment of FIG. 2.

FIG. 3 is a circuit diagram of the linearized complementary common gate amplifier 200 of the low noise amplifier according to the embodiment of FIG. 2. Referring to FIG. 3, the linearized complementary common gate amplifier 200 includes the second main transistor unit 210 and the second auxiliary transistor unit 220. The second main transistor unit 210 includes a complementary common gate amplifier including a fourth NMOS transistor N4 and a fourth PMOS transistor P4 connected to the output terminal of the optimum noise and input impedance matching capacitor $C_L$, and the second auxiliary transistor unit 220 includes a fifth NMOS transistor N5 and a fifth PMOS transistor P5 connected in parallel to the second main transistor unit 210.

In the linearized complementary common gate amplifier 200, the drain of the fourth NMOS transistor N4 is connected to the drain of the fifth NMOS transistor N5, the drain of the fourth PMOS transistor P4 is connected to the drain of the fifth PMOS transistor P5, the gate of the fourth NMOS transistor N4 and the gate of the fourth PMOS transistor P4 are connected to a ground via capacitors $C_5$ and $C_6$. The gate of the fifth NMOS transistor N5 and the gate of the fifth PMOS transistor P5 are connected to a ground via capacitors $C_7$ and $C_8$.

The second main transistor unit 210 includes the fourth NMOS transistor N4 and the fourth PMOS transistor P4 configured such that the sources thereof are connected to the output terminal of the optimum noise and input impedance matching capacitor $C_L$ and the drains thereof are connected to a resonator circuit; resistors $R_7$ and $R_8$ respectively connected to the gates of the fourth NMOS transistor N4 and the fourth PMOS transistor P4 and configured to apply bias; and a pair of AC coupling capacitors $C_5$ and $C_6$ configured such that the first ends thereof are connected to the gates of the fourth NMOS transistor N4 and the fourth PMOS transistor P4 and the second ends thereof are connected to a ground. The AC coupling capacitor $C_5$ is connected to the gate of the fourth NMOS transistor N4, and the AC coupling capacitor $C_6$ is connected to the gate of the fourth PMOS transistor P4. The gates of the fourth NMOS transistor N4 and the fourth PMOS transistor P4 are connected to a ground via the AC coupling capacitors $C_5$ and $C_6$.

The drain of the fourth NMOS transistor N4 is connected to a resonator circuit $LC_1$ including an inductor and a capacitor, the gate thereof is connected to the bias resistor $R_7$, and the source thereof is connected to the output terminal of the optimum noise and input impedance matching capacitor $C_L$. The drain of the fourth PMOS transistor P4 is connected to a resonator circuit $LC_2$, the gate thereof is connected to the bias resistor $R_8$, and the source thereof is connected to the output terminal of the optimum noise and input impedance matching capacitor $C_L$.

The second auxiliary transistor unit 220 includes the fifth NMOS transistor N5 configured such that the source thereof is connected to the common source of the second main transistor unit and the drain thereof is connected to the drain of the fourth NMOS transistor N4; the fifth PMOS transistor P5 configured such that the source thereof is connected to the common source of the second main transistor unit and the drain thereof is connected to the drain of the fourth PMOS transistor P4; and the AC coupling capacitors $C_7$ and $C_8$ configured such that the first ends thereof are respectively connected to the gates of the fifth NMOS transistor N5 and the fifth PMOS transistor P5 and the second ends thereof are connected to a ground. The gate of the fifth NMOS transistor N5 is connected to the bias resistor $R_9$ and the AC coupling capacitor $C_7$, and the gate of the fifth PMOS transistor P5 is connected to the bias resistor $R_{10}$ and the AC coupling capacitor $C_8$. The gates of the fifth NMOS transistor N5 and the fifth PMOS transistor P5 are connected to a ground via the AC coupling capacitors $C_7$ and $C_8$.

The drain of the fourth NMOS transistor N4 and the drain of the fifth NMOS transistor N5 are connected to output via $C_9$, and the drain of the fourth PMOS transistor P4 and the drain of the fifth PMOS transistor P5 is connected to output via $C_{10}$. The drains of the fifth NMOS transistor N5 and the fifth PMOS transistor P5 are connected to the drains of the fourth NMOS transistor N4 and fourth PMOS transistor P4 of the second main transistor unit 210 in such a way that the NMOS transistors are connected to each other and the PMOS transistors are connected to each other. Then the AC coupling capacitors $C_9$ and $C_{10}$ are connected to the common output, so that the drain current of the PMOS transistor and the drain current of the NMOS transistor are combined and then output.

Each of the resonator circuits $LC_1$ and $LC_2$ of the second main transistor unit 210 includes an inductor and a capacitor connected in parallel, and has a very high impedance value at resonant frequency, so that the current produced by the second main transistor unit 210 and the second auxiliary transistor unit 220 can be output without the intervention of a resonator.

The low noise amplifier may further include a power supply unit (not shown) for driving the low noise amplifier.

Since the output terminal of the linearized complementary common source low noise amplifier includes the drains of transistors, a reduction in linearity may be caused by the large voltage swing of the drains. Accordingly, in the low noise amplifier according to another embodiment of the present invention, the linearized complementary common gate amplifier may be connected to the output terminal of the linearized complementary common source low noise amplifier so as to prevent linearity from being reduced using low-impedance connection. Alternatively, in order to produce low impedance at the output terminal of the linearized complementary common source low noise amplifier, methods, other than the method of connecting a linearized complementary common gate amplifier, may be employed.

Figure 4:
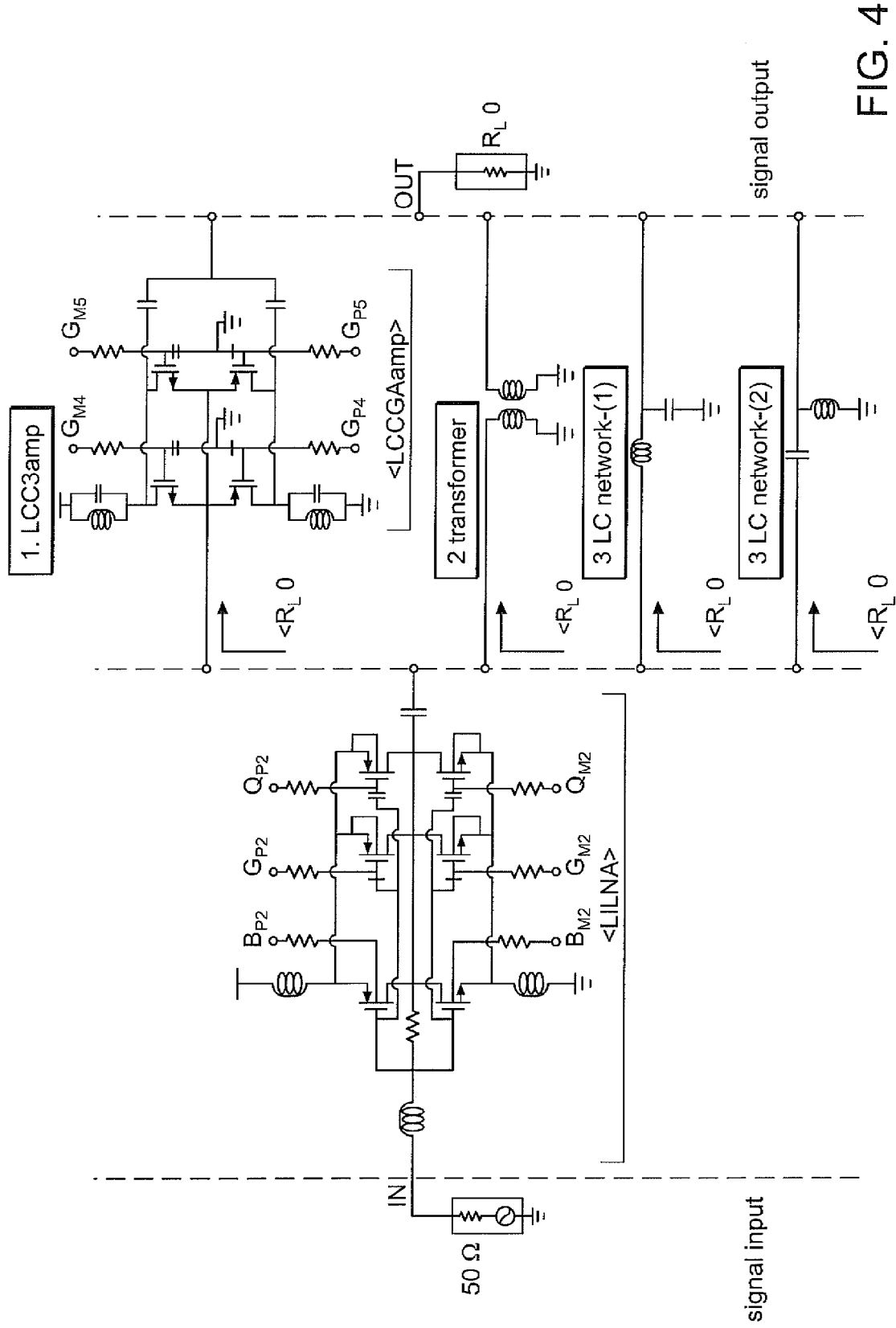
FIG. 4 is a circuit diagram of a low noise amplifier according to still another embodiment of the present invention, which includes a linearized complementary common gate amplifier and alternative configurations.

FIG. 4 is a circuit diagram of a low noise amplifier according to still another embodiment of the present invention, which includes a linearized complementary common gate amplifier and alternative configurations. In this embodiment of the present invention, as shown in FIG. 4, it is possible to connect a transformer or an LC network to the output terminal of the optimum noise and input impedance matching capacitor $C_L$ connected in common to the output terminals of the first main transistor unit and the first auxiliary transistor unit, instead of connecting the linearized complementary common gate amplifier. The LC network may include an inductor connected to the output terminal of the optimum noise and input impedance matching capacitor $C_L$ and a capacitor configured such that one end thereof is connected to the inductor and the remaining end thereof is connected to a ground, and may be configured such that a node at which the inductor and the capacitor are connected is connected to the output terminal. Alternatively, the LC network may include a capacitor connected to the output terminal of the optimum noise and input impedance matching capacitor $C_L$ and an inductor configured such that one end thereof is connected to the capacitor and the remaining end thereof is connected to a ground, and may be configured such that a node at which the capacitor and the inductor are connected is connected to the output terminal. Since the inductor and the capacitor are all passive elements, linearity can be maintained without requiring power amplification.

The operation of the low noise amplifier according to the embodiment of the present invention will now be described. A signal enters into the input terminal and is then input to the gates of the first NMOS transistor N1 and the first PMOS transistor P1 at the same time, and the signal input to the transistors is simultaneously subjected to the amplification process of the transistors and the linearization process of the first auxiliary transistor unit and is then output through the drains of the first NMOS transistor N1 and the first PMOS transistor P1. The signal output through the drains of the first NMOS transistor N1 and the first PMOS transistor P1 passes through the optimum noise and input impedance matching capacitor $C_L$ 130, and is output through the output terminal. Since the optimum noise and input impedance matching capacitor $C_L$ 130 may be considered to be a resistance component from the standpoint of the input terminal, both input impedance and optimum noise can be matched at the same time. Furthermore, due to the circuit structure, the optimum noise and input impedance matching capacitor $C_L$ 130 is connected after input voltage has been converted into output current by the transistors, and therefore the noise figure is not influenced.

The operation of the amplifier circuit of the present invention and the principle of the improvement of linearity will now be described in detail. The low noise amplifier according to the embodiment of the present invention improves both small-signal linearity IIP3/OIP3 and large-signal linearity IP1 dB/OP1 dB using the linearized complementary common source low noise amplifier to which body biasing linearization and complementary superposition linearization have been applied.

(1) Small-signal Linearization (Improvement of OIP3)—Body Biasing Linearization

There is the disadvantage of the minimum points of the third derivative transconductance $g_3 = d^3 I_{drain}/dV_{gs}^3$ of the first PMOS transistor P1 and the first NMOS transistor N1 being generally inconsistent with each other. This causes the small-signal linearity to be reduced, and considerably reduces the linearity index IIP3 (Input 3rd Intercept Point)/OIP3 (Output 3rd Intercept Point). Accordingly, in the present invention, in order to compensate for the above, body bias is applied to the bodies of the first PMOS transistor P1 and the first NMOS transistor N1 using the resistors $R_1$ and $R_2$. The body bias of a transistor varies the threshold voltage $V_{th}$, and the variation of $V_{th}$ laterally moves the profile of the third derivative transconductance $g_3$. Accordingly, different minimum $g_3$ points may be located at the same location by adjusting the body bias voltage of the first PMOS transistor P1 and the first NMOS transistor N1 using the body biasing. Accordingly, the nonlinearity caused by a third-order harmonic component can be mitigated by operating the transistors at the minimum $g_3$ points.

(2) Large-signal Linearization—Complementary Superposition Linearization

Since it is difficult to improve large-signal linearity using the body biasing linearization method because the minimized third derivative transconductance $g_3$ region is small, the present invention employs complementary superposition linearization so as to improve large-signal linearity.

Figure 5:
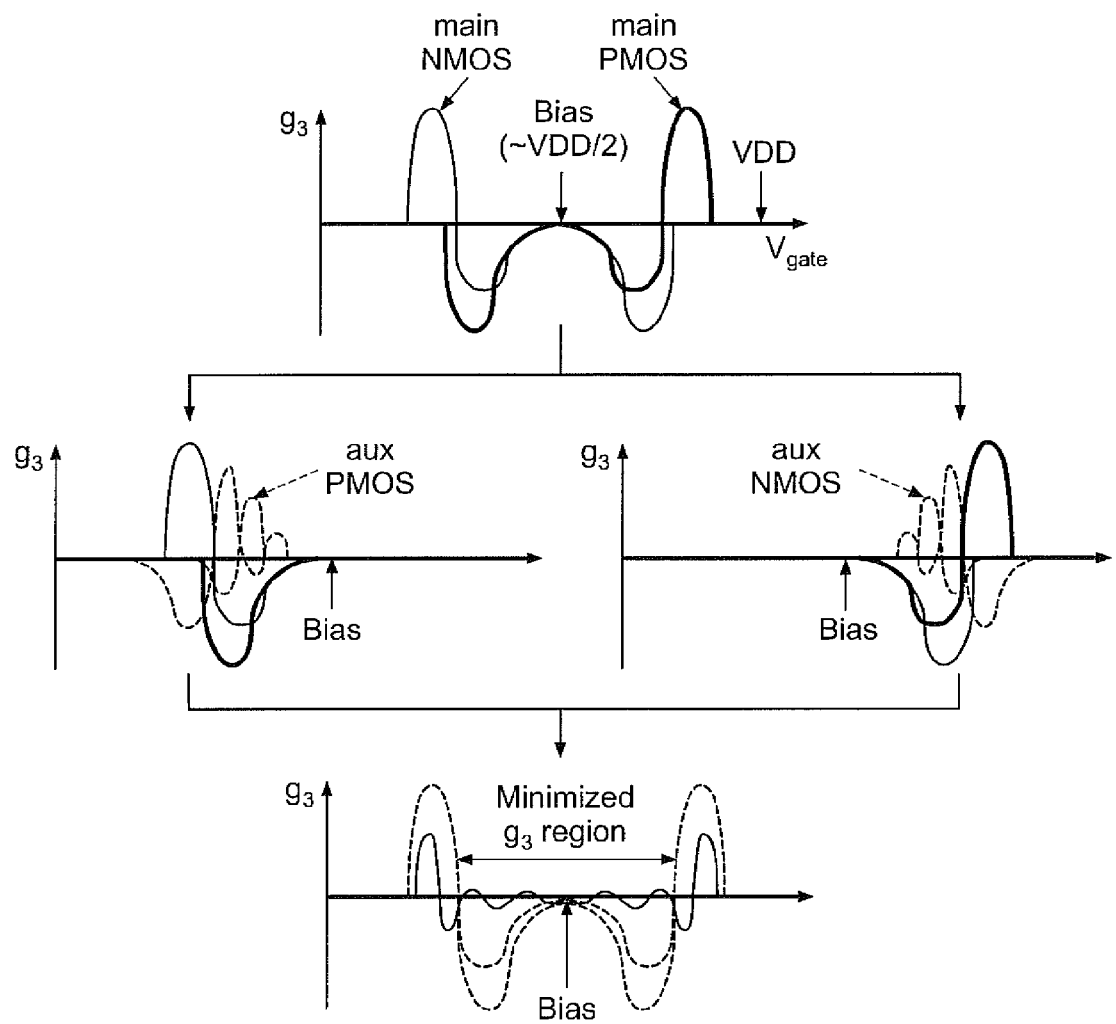
FIG. 5 is a graph showing the third derivative W transconductance $g_3$ profile of a common source low noise amplifier using complementary superposition in order to illustrate the operational characteristics of a low noise amplifier according to an embodiment of the present invention.

FIG. 5 is a graph showing the third derivative transconductance profile of a common source low noise amplifier using complementary superposition in order to illustrate the operational characteristics of a low noise amplifier according to an embodiment of the present invention. "Complementary Superposition linearization" is achieved by the first main transistor unit 110 and the first auxiliary transistor unit 120. As shown in FIG. 5, the first auxiliary transistor unit 120 suppresses the nonlinearity component of the first main transistor unit 110. The first NMOS transistor N1 of the first main transistor unit 110 minimizes the third derivative transconductance $g_3$ component using the second and third PMOS transistors P2 and P3 of the first auxiliary transistor unit 120, and the first PMOS transistor P1 of the first main transistor unit 110 minimizes the third derivative transconductance $g_3$ component using the second and third NMOS transistors N2 and N3 of the first auxiliary transistor unit 120. Referring to FIG. 5, the low noise amplifier according to the present invention can acquire a considerably widened, minimized $g_3$ region using the above-described configuration.

In order to improve both small-signal linearity and large-signal linearity, the first derivative transconductance $g_1 = dI_{drain}/dV_{gs}$ and the second derivative transconductance $g_2 = d^2I_{drain}/dV_{gs}^2$ as well as the third derivative transconductance $g_3 = d^3I_{drain}/dV_{gs}^3$ should be taken into consideration. Within the input voltage swing range, the first derivative transconductance $g_1$ should have a constant value, and the magnitudes of the second derivative transconductance $g_2$ and the third derivative transconductance $g_3$ should be minimized.

Figure 6:
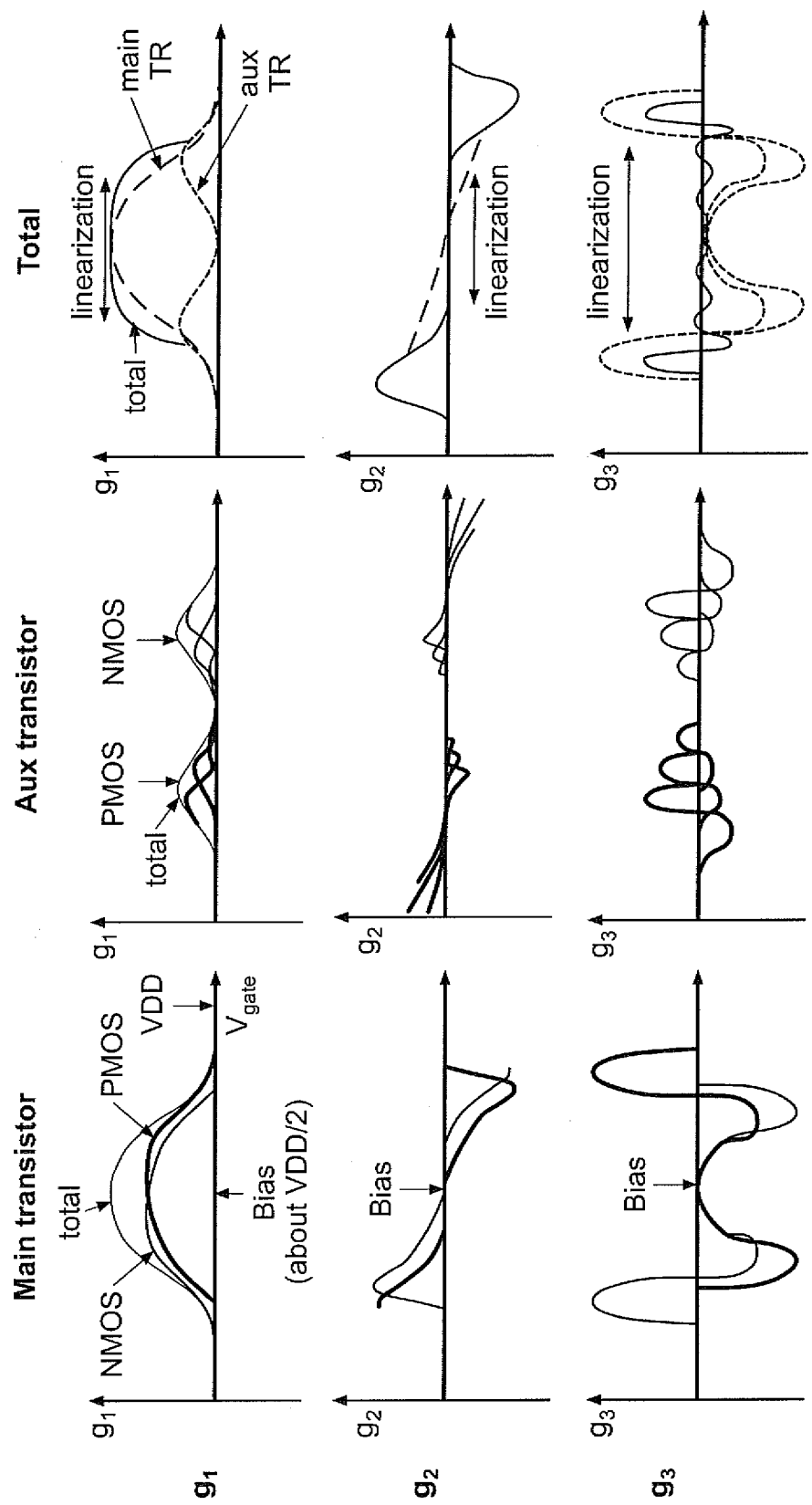
FIG. 6 is a graph showing the profiles of the first derivative transconductance $g_1$, second derivative transconductance $g_2$ and third derivative transconductance $g_3$ of the linearization low noise amplifier to which body biasing and complementary superposition in the linearized complementary common source low noise amplifier of the low noise amplifier according to the embodiment of FIG. 1 have been applied.

FIG. 6 is a graph showing the profiles of the first derivative transconductance $g_1$, second derivative transconductance $g_2$ and third derivative transconductance $g_3$ of the linearization low noise amplifier to which body biasing and complementary superposition in the linearized complementary common source low noise amplifier of the low noise amplifier according to the embodiment of FIG. 1 have been applied. Referring to FIG. 6, the $g_1$, $g_2$ and $g_3$ related linearization processes of the complementary superposition linearization will now be described in detail. In the linearization process related to the first derivative transconductance $g_1$, when $g_1$ of the first main transistor unit decreases in inverse proportion to the input voltage, the amplification of the first auxiliary transistor unit is further increased, and therefore the output current of the first main transistor unit and the output current of the first auxiliary transistor unit are added to each other, with the result that $g_1$ is kept constant regardless of the large voltage swing of the input signal. Meanwhile, in the linearization process related to the second derivative transconductance $g_2$, the second-order harmonic current component of the PMOS and the second-order harmonic current component of the NMOS cancel each other because the phases thereof are opposite, with the result that $g_2$ is minimized. In the linearization process related to the third derivative transconductance $g_3$, when the first main transistor unit in which $g_3$ has a negative value and the first auxiliary transistor unit in which $g_3$ has a positive value are superposed on each other, $g_3$ is minimized thanks to cancellation.

(3) Linearization Using Complementary Common Gate Amplifier

The output terminal of the above-described linearized complementary common source low noise amplifier includes the drains of transistors. The large voltage swing of the drains may cause a reduction in linearity attributable to $g_{ds}$. Accordingly, in order to increase linearity, the voltage swing should be minimized by decreasing the load impedance of the output terminal. However, low load impedance reduces gain, so that the output terminal of the linearized complementary common source low noise amplifier should be connected to low impedance in order to further improve linearity without sacrificing gain. A reduction in linearity should be prevented by low impedance connection, and high gain should be obtained by high impedance driving at the output terminal of the entire low noise amplifier. In general, in a radio receiver, an output from a low noise amplifier becomes an input to a mixer. In the case of a passive mixer, input impedance is 80~100 ohm. Accordingly, the low noise amplifier should operate an 80~100 ohm load without reducing linearity.

Reductions in linearity caused by the output voltage swing of a transistor amplifier may be classified into the following two types. "Input limited" refers to the case where linear input voltage is converted into nonlinear drain current due to nonlinear g1, g2, g3 while "output limited" refers to the case where the large voltage swing of the output reduces drain current due to gds between the drain and the source. Due to very large output voltage swing, there is the possibility of the transistors operating in the triode region.

Figure 7:
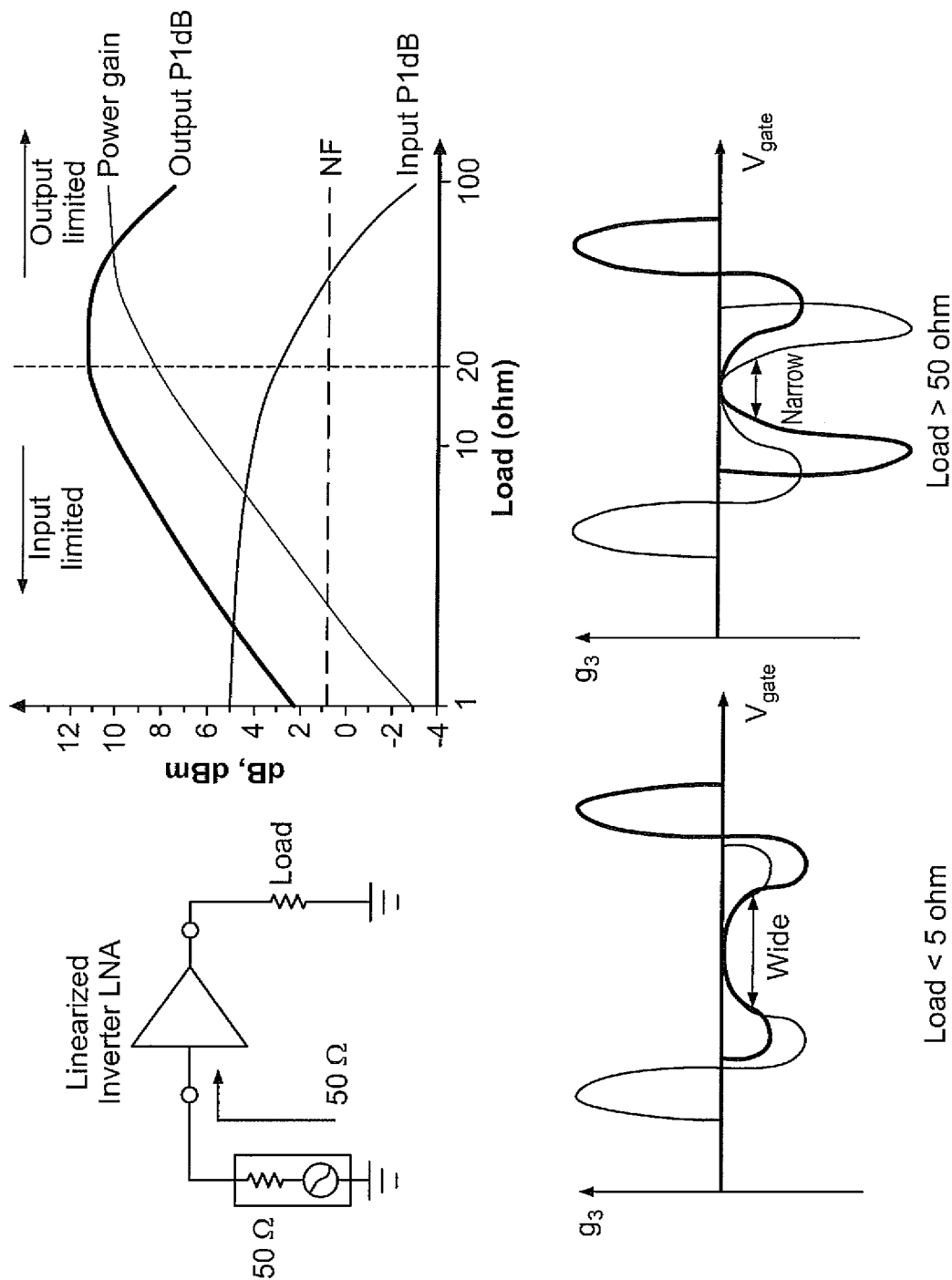
FIG. 7 is a diagram illustrating "input limited" and "output limited" factors which limit the linearity characteristic.

FIG. 7 is a diagram illustrating "input limited" and "output limited" factors which limit the linearity characteristic. Referring to FIG. 7, when low load impedance (for example, lower than 5Ω) is driven, the minimized interval of $g_3$ of the LNA is wide. However, high load impedance (for example, higher than 50Ω) makes the minimum interval of $g_3$ considerably narrow. Accordingly, even when linearization is performed using the "complementary superposition" method, there is a limitation to the minimization of $g_3$ having a large negative value. Accordingly, the output load should have low impedance.

In the low noise amplifier of the present invention, a structure such as a linearized complementary common gate amplifier, a transformer or an LC network may be connected to the linearized complementary common source low noise amplifier so as to prevent linearity from being reduced using low impedance connection.

The input impedance of a common gate is represented by $$\frac{1}{g_m}.$$

Figure 8:
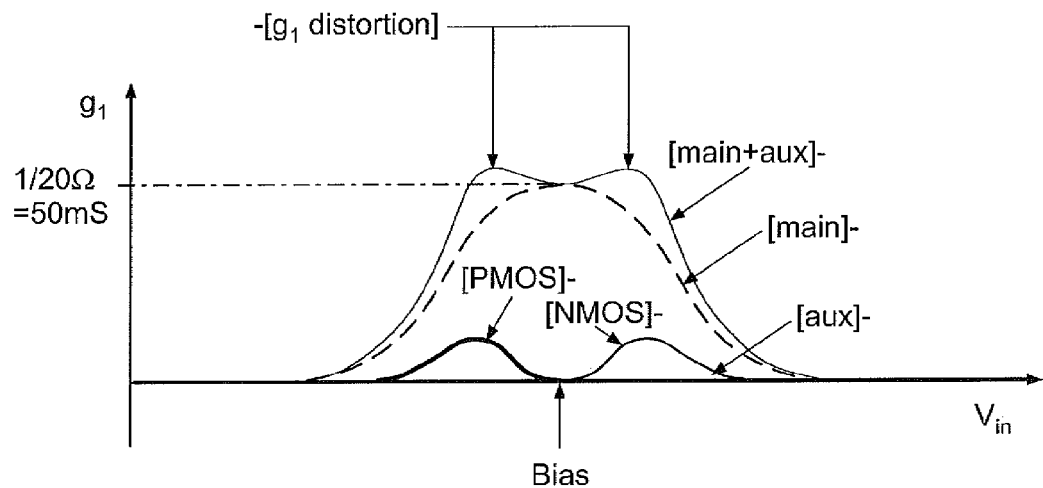
FIG. 8 is a graph showing the profile of $g_1$ in the linearized complementary common gate amplifier of the low noise amplifier according to the embodiment of FIG. 1.

In this case, as $g_m$ increases, the input impedance of the amplifier decreases. However, this has the disadvantage of requiring high current in order to increase $g_m$. FIG. 8 is a graph showing the profile of $g_1$ in the linearized complementary common gate amplifier of the low noise amplifier according to the embodiment of FIG. 1. When a complementary common gate amplifier using a PMOS and an NMOS is configured, the same amount of power is consumed but the input impedance further decreases in the form of $$\frac{1}{g_{m\_P}} + \frac{1}{g_{m\_N}},$$

compared to an NMOS common gate amplifier. The input impedance further reduced as described above minimizes the voltage swing, and therefore suppresses a reduction in linearity caused by $g_{ds}$.

However, when only the configuration is used, $g_1$ ($=g_m$) is not constant for the large input voltage swing, so that linearity may be reduced. Accordingly, in the low noise amplifier of the present invention, the second auxiliary transistor unit is added to the linearized complementary common gate amplifier, and the nonlinear $g_1$ of the second main transistor unit is linearized to a wider region by the second auxiliary transistor unit, thereby implementing the linearized complementary common gate amplifier. As a result, the influence of the large voltage swing of the drain is minimized by maintaining $g_1$ in a maximally wide range, as shown in FIG. 8.

Figure 9:
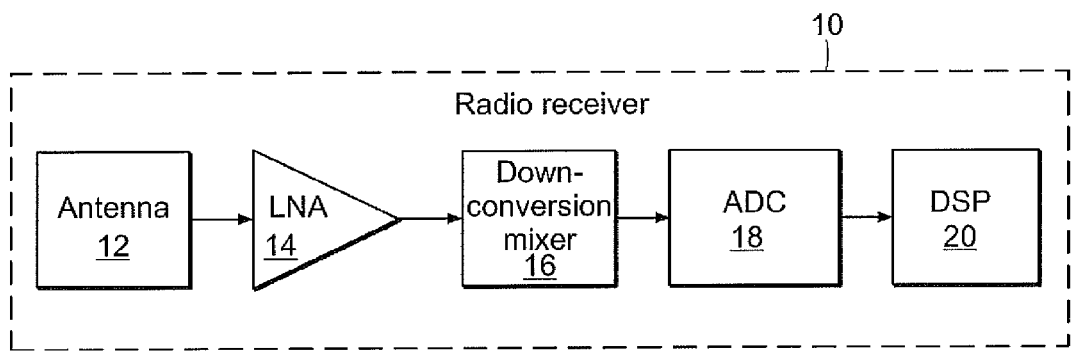
FIG. 9 is a schematic block diagram of a radio receiver including a low noise amplifier according to another embodiment of the present invention.

Still another embodiment of the present invention is directed to a radio receiver including the above-described low noise amplifier. FIG. 9 is a block diagram of a radio receiver 10 according to an embodiment of the present invention. Referring to FIG. 9, the radio receiver 10 includes a low noise amplifier 14 connected to an antenna 12 and configured to amplify an input wireless signal; a mixer 16 configured to down-convert the frequency of output signal of the low noise amplifier circuit; an ADC 18 configured to convert the output signal of the mixer into a digital signal; and a digital signal processor 20 configured to recover data from the digital signal. The low noise amplifier 14 includes a first main transistor unit including a first NMOS transistor and a first PMOS transistor configured to form a complementary common source amplifier, a feedback-type resistor connected in parallel between the drains of the first NMOS transistor and the first PMOS transistor and configured to generate biases to the two transistors, and bias resistors connected to the bodies of the first PMOS transistor and the first NMOS transistor; a first auxiliary transistor unit including transistors connected in parallel to the two transistors of the first main transistor unit; and an optimum noise and input impedance matching capacitor $C_L$ connected in common to the output terminals of the first main transistor unit and the first auxiliary transistor unit.

The first auxiliary transistor unit 120 includes a second PMOS transistor P2 configured such that the source and drain of the first PMOS transistor P1 are connected in parallel thereto; a third PMOS transistor P3 connected behind the second PMOS transistor P2 and configured such that the source and drain thereof are connected in parallel to the first PMOS transistor P1 and the second PMOS transistor P2; a second NMOS transistor N2 configured such that the source and drain of the first NMOS transistor N1 are connected in parallel thereto; and a third NMOS transistor N3 connected behind the second NMOS transistor N2 and configured such that the source and drain thereof are connected in parallel to the first NMOS transistor N1 and the second NMOS transistor N2. The source and drain of the third PMOS transistor P3 are respectively connected to the source and drain of the first PMOS transistor P1, and are also respectively connected to the source and drain of the second PMOS transistor P2. The source and drain of the third NMOS transistor N3 are respectively connected to the source and drain of the first NMOS transistor N1, and are also respectively connected to the source and drain of the second NMOS transistor N2. The gates of the second and third PMOS transistors and the second and third NMOS transistors are connected in parallel to the gates of the transistors of the first main transistor unit via AC coupling capacitors, and bias resistors having large resistance values are respectively connected to the gates of the all auxiliary transistors.

The optimum noise and input impedance matching capacitor $C_L$ derives the real part of the impedance of the input terminal without influencing noise matching, thereby enabling input impedance matching and optimum noise matching to be achieved independently.

In another embodiment, the low noise amplifier may further include a linearized complementary common gate amplifier connected to the optimum noise and input impedance matching capacitor $C_L$. The output terminal of the first main transistor unit and the output terminal of the first auxiliary transistor unit are connected to each other, and a linearized complementary common gate amplifier is connected to an output node via an optimum noise and input impedance matching capacitor $C_L$. The linearized complementary common gate amplifier includes a second main transistor unit configured to include a fourth NMOS transistor and a fourth PMOS transistor connected to the optimum noise and input impedance matching capacitor $C_L$; and a second auxiliary transistor unit connected in parallel to the second main transistor unit, and configured to include a fifth NMOS transistor and a fifth PMOS transistor.

A transformer or an LC network, instead of the linearized complementary common gate amplifier, may be connected to the output terminal of the optimum noise and input impedance matching capacitor $C_L$.

The LC network may include an inductor connected to the output terminal of the optimum noise and input impedance matching capacitor $C_L$ and a capacitor configured such that one end thereof is connected to the inductor and a remaining end thereof is connected to a ground, and may be configured such that a node at which the inductor and the capacitor are connected is connected to the output terminal. Alternatively, the LC network may include a capacitor connected to the output terminal of the optimum noise and input impedance matching capacitor $C_L$ and an inductor configured such that one end thereof is connected to the capacitor and a remaining end thereof is connected to a ground, and may be configured such that a node at which the capacitor and the inductor are connected is connected to the output terminal.

The radio receiver 10 may be part of a radio communication device which is provided to receive wireless audio, video and/or signals. The radio communication device may include a radio transceiver which transmits and receives radio signals to and from other devices for, for example, audio communication, video communication and/or data communication. Accordingly, the radio receiver may include other components which have not been illustrated in FIG. 9 for ease of illustration.

In a radio receiver, an antenna receives an RF signal and then provides the received signal to the low noise amplifier 14. The low noise amplifier 14 receives the signal, received by the antenna 12, as an input signal. The low noise amplifier 14 may be configured to treat the input signal as a single-ended or differential signal. The low noise amplifier 14 amplifies the received input signal so as to prepare the signal for the additional processing of a down-conversion mixer 16, an ADC, 18 and a digital signal processor 20. The antenna 12 may receive signals of frequencies in a wide range.

Furthermore, since a signal received by the low noise amplifier 14 may be weak, the low noise amplifier should have a low noise figure NF. The term "noise figure" refers to the ratio of remaining noise in the case where a device itself does not introduce noise to the actual output noise of the low noise amplifier 14. It is important for the low noise amplifier 14 to have a low noise figure so that the influence of noise generated by the low noise amplifier 14 on the input signal can be reduced. When the low noise amplifier 14 has a low noise figure, the low noise amplifier 14 can amplify a weak signal, received by the antenna 12, without considerably deteriorating an output signal.

The low noise amplifier 14 provides the amplified signal to the down-conversion mixer 16. The down-conversion mixer 16 may be any type of mixer which converts the frequency of a signal in a wide band into a baseband frequency, like a Zero Intermediate Frequency (ZIF) or Low Intermediate Frequency (LIF) down-conversion mixer. The down-conversion mixer 16 provides the baseband signal to the analog-digital converter 18 which converts an analog baseband signal into digital data. The digital signal processor 20 demodulates digital data provided by the analog-digital converter 18. In some cases, the radio receiver may include a plurality of low noise amplifiers so as to deal with the sub-bands of the entire wide frequency band.

The low noise amplifier according to the present invention may be used in various electronic devices, such as an RFID system and a car navigation system, in addition to the radio receiver of the communication system.

The low noise amplifiers according to various embodiments of the present invention can considerably improve a noise characteristic using the matching of both input impedance and noise in a low noise amplifier circuit structure, and can considerably improve linearity using the body biasing and complementary superposition of transistors. Furthermore, when a two-stage amplifier is implemented to include a low noise amplifier having a linearized complementary common source amplifier structure and a linearized complementary common gate amplifier, both ultra-high linearity and a low noise characteristic can be achieved. Accordingly, when the low noise amplifiers according to various embodiments of the present invention are used, it is possible to implement small-sized radio receivers capable of supporting multi-band, multi-mode, multi-standard connectivity at low cost without using SAW filters.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A low noise amplifier having both ultra-high linearity and a low noise characteristic, comprising:
   a first main transistor unit comprising a first NMOS transistor and a first PMOS transistor configured to faun a complementary common source amplifier, a feedback-type resistor connected in parallel between drains of the first NMOS transistor and the first PMOS transistor and configured to generate biases to the two transistors, and bias resistors connected to bodies of the first PMOS transistor and the first NMOS transistor;
   a first auxiliary transistor unit comprising transistors connected in parallel to the two transistors of the first main transistor unit; and
   an optimum noise and input impedance matching capacitor CL connected in common to output terminals of the first main transistor unit and the first auxiliary transistor unit.

2. The low noise amplifier as set forth in claim 1, wherein the first auxiliary transistor unit comprises:
   a second PMOS transistor configured such that a source and drain of the first PMOS transistor are connected in parallel thereto;
   a third PMOS transistor connected behind the second PMOS transistor and configured such that a source and drain thereof are connected in parallel to the first PMOS transistor and the second PMOS transistor;
   a second NMOS transistor configured such that a source and drain of the first NMOS transistor are connected in parallel thereto; and
   a third NMOS transistor connected behind the second NMOS transistor and configured such that a source and drain thereof are connected in parallel to the first NMOS transistor and the second NMOS transistor.

3. The low noise amplifier as set forth in claim 2, wherein gates of the second and third PMOS transistors and the second and third NMOS transistors of the first auxiliary transistor unit are connected in parallel to gates of the transistors of the first main transistor unit via Alternating Current (AC) coupling capacitors, and bias resistors are connected to respective gates of the all auxiliary transistors.

4. The low noise amplifier as set forth in claim 2, wherein the first auxiliary transistor unit further comprises one or more auxiliary transistors in addition to the second and third PMOS transistors and the second and third NMOS transistors.

5. An electronic device comprising the low noise amplifier set forth in claim 2.

6. The low noise amplifier as set forth in claim 1, wherein the first auxiliary transistor unit is configured to allow linear output current to be generated by adjusting bias voltages of the second PMOS transistor, the third PMOS transistor, the second NMOS transistor and the third NMOS transistor, thereby preventing linearity from being reduced by a voltage swing from input signal.

7. The low noise amplifier as set forth in claim 1, further comprising a linearized complementary common gate amplifier connected to the optimum noise and input impedance matching capacitor CL.

8. The low noise amplifier as set forth in claim 7, wherein the linearized complementary common gate amplifier comprises:
   a second main transistor unit configured to comprise a fourth NMOS transistor and a fourth PMOS transistor connected to an output terminal of the optimum noise and input impedance matching capacitor CL; and
   a second auxiliary transistor unit connected in parallel to the second main transistor unit, and configured to comprise a fifth NMOS transistor and a fifth PMOS transistor.

9. The low noise amplifier as set forth in claim 8, wherein the second main transistor unit comprises:
   the fourth NMOS transistor and the fourth PMOS transistor configured such that sources thereof are connected to the output terminal of the optimum noise and input impedance matching capacitor CL and drains thereof are connected to a resonator circuit; and
   resistors and respectively connected to the gates of the fourth NMOS transistor and the fourth PMOS transistor, and configured to apply bias;
   wherein the gates of the fourth NMOS transistor and the fourth PMOS transistor are connected to a ground via respective AC coupling capacitors.

10. The low noise amplifier as set forth in claim 8, wherein the second auxiliary transistor unit comprises:
    the fifth NMOS transistor configured such that a source thereof is connected to a common source of the second main transistor unit and a drain thereof is connected to a drain of the fourth NMOS transistor;
    the fifth PMOS transistor configured such that a source thereof is connected to the common source of the second main transistor unit and the drain thereof is connected to the drain of the fourth PMOS transistor;
    wherein gates of the fifth NMOS transistor and the fifth PMOS transistor are connected to a ground via AC coupling capacitors and bias resistors are respectively connected thereto.

11. The low noise amplifier as set forth in claim 10, wherein drains of the fifth NMOS transistor and the fifth PMOS transistor are connected to drains of the fourth NMOS transistor and fourth PMOS transistor of the second main transistor unit in such a way that the NMOS transistors are connected to each other and the PMOS transistors are connected to each other, and AC coupling capacitors are connected to the common output, so that drain current of the PMOS transistor and drain current of the NMOS transistor are combined and then output.

12. The low noise amplifier as set forth in claim 1, further comprising a transformer or an LC network connected to an output terminal of the optimum noise and input impedance matching capacitor CL.

13. The low noise amplifier as set forth in claim 12, wherein the LC network comprises an inductor connected to the output terminal of the optimum noise and input impedance matching capacitor CL and a capacitor configured such that one end thereof is connected to the inductor and a remaining end thereof is connected to a ground, and is configured such that a node at which the inductor and the capacitor are connected is connected to the output terminal, or the LC network comprises a capacitor connected to the output terminal of the optimum noise and input impedance matching capacitor CL and an inductor configured such that one end thereof is connected to the capacitor and a remaining end thereof is connected to a ground, and is configured such that a node at which the capacitor and the inductor are connected is connected to the output terminal.

14. An electronic device comprising the low noise amplifier set forth in claim 1.

15. A radio receiver, comprising a low noise amplifier for amplifying an input wireless signal; a mixer for down-converting a frequency of an output signal of the low noise amplifier circuit; an analog to digital converter (ADC) for converting an output signal of the mixer into a digital signal; and a digital signal processor for recovering data from the digital signal,
wherein the low noise amplifier comprises:
a first main transistor unit comprising a first NMOS transistor and a first PMOS transistor configured to form a complementary common source amplifier, a feedback-type resistor connected in parallel between drains of the first NMOS transistor and the first PMOS transistor and configured to generate biases to the two transistors, and bias resistors connected to bodies of the first PMOS transistor and the first NMOS transistor;
a first auxiliary transistor unit comprising transistors connected in parallel to the two transistors of the first main transistor unit; and
an optimum noise and input impedance matching capacitor CL connected in common to output terminals of the first main transistor unit and the first auxiliary transistor unit.

16. The radio receiver as set forth in claim 15, wherein:
the first auxiliary transistor unit of the low noise amplifier comprises:
a second PMOS transistor configured such that a source and drain of the first PMOS transistor are connected in parallel thereto;
a third PMOS transistor connected behind the second PMOS transistor and configured such that a source and drain thereof are connected in parallel to the first PMOS transistor and the second PMOS transistor;
a second NMOS transistor configured such that a source and drain of the first NMOS transistor are connected in parallel thereto; and
a third NMOS transistor connected behind the second NMOS transistor and configured such that a source and drain thereof are connected in parallel to the first NMOS transistor and the second NMOS transistor; and
gates of the second and third PMOS transistors and the second and third NMOS transistors are connected in parallel to gates of the transistors of the first main transistor unit via AC coupling capacitors, and bias resistors are respectively connected to gates of the all auxiliary transistors.

17. The radio receiver as set forth in claim 15, wherein the low noise amplifier further comprises a linearized complementary common gate amplifier connected to the optimum noise and input impedance matching capacitor CL.

18. The radio receiver as set forth in claim 17, wherein the linearized complementary common gate amplifier comprises:
a second main transistor unit configured to comprise a fourth NMOS transistor and a fourth PMOS transistor connected to an output terminal of the optimum noise and input impedance matching capacitor CL; and
a second auxiliary transistor unit connected in parallel to the second main transistor unit and configured to comprise a fifth NMOS transistor and a fifth PMOS transistor.

19. The radio receiver as set forth in claim 15, wherein the low noise amplifier further comprises a transformer or an LC network connected to an output terminal of the optimum noise and input impedance matching capacitor CL.

20. The radio receiver as set forth in claim 19, wherein the LC network comprises an inductor connected to the output terminal of the optimum noise and input impedance matching capacitor CL and a capacitor configured such that one end thereof is connected to the inductor and a remaining end thereof is connected to a ground, and is configured such that a node at which the inductor and the capacitor are connected is connected to the output terminal, or the LC network comprises a capacitor connected to the output terminal of the optimum noise and input impedance matching capacitor CL and an inductor configured such that one end thereof is connected to the capacitor and a remaining end thereof is connected to a ground, and is configured such that a node at which the capacitor and the inductor are connected is connected to the output terminal.

* * * * *